(12) United States Patent
Kim et al.

(10) Patent No.: US 10,992,290 B2
(45) Date of Patent: Apr. 27, 2021

(54) LEVEL SHIFTER AND SEMICONDUCTOR DEVICE INCLUDING THE SAME AND OPERATION METHOD THEREOF

(71) Applicant: Samsung Electronics Co., Ltd., Suwon-si (KR)

(72) Inventors: Yong-min Kim, Incheon (KR); Kyung-hoon Lee, Suwon-si (KR); Eun-seok Shin, Seoul (KR); Michael Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/734,721

(22) Filed: Jan. 6, 2020

(65) Prior Publication Data
US 2020/0244252 A1 Jul. 30, 2020

(30) Foreign Application Priority Data
Jan. 24, 2019 (KR) .......................... 10-2019-0009244

(51) Int. Cl.
*H03K 19/0175* (2006.01)
*H03K 3/037* (2006.01)
(Continued)

(52) U.S. Cl.
CPC ........... *H03K 3/037* (2013.01); *G09G 3/3258* (2013.01); *H03K 19/0185* (2013.01);
(Continued)

(58) Field of Classification Search
CPC ....... H03K 19/00315; H03K 19/01721; H03K 19/018507; H03K 19/018521;
(Continued)

(56) References Cited

U.S. PATENT DOCUMENTS 5,675,278 A * 10/1997 Tanaka ............. H03K 3/356113
327/333
6,407,579 B1 6/2002 Goswick
(Continued)

FOREIGN PATENT DOCUMENTS

| KR | 10-2002-0007336 | 1/2002 |
| KR | 10-205-0079180 A | 8/2005 |
| KR | 10-2009-0118311 | 11/2009 |

*Primary Examiner* — Long Nguyen
(74) *Attorney, Agent, or Firm* — Muir Patent Law, PLLC

(57) ABSTRACT

A level shifter for outputting an output voltage having a voltage level range different from a voltage level range of a received input voltage is disclosed. The level shifter includes: a current mirror configured to copy a reference current flowing through a first mirror transistor to a second mirror transistor; a current mirror control circuit electrically connected to the current mirror by a sink node and including a plurality of control transistors configured to control the current mirror; and an output circuit configured to output an output voltage based on a voltage level of the sink node, wherein a first control transistor of the plurality of control transistors receives the output voltage fed back to a gate terminal of the first control transistor, and a second control transistor of the plurality of control transistors receives an inverted output voltage fed back to a gate terminal of the second control transistor.

20 Claims, 13 Drawing Sheets

(51) Int. Cl.
*G09G 3/3258* (2016.01)
*H03K 19/0185* (2006.01)

(52) U.S. Cl.
CPC ............. *H03K 19/017509* (2013.01); *H03K 19/018521* (2013.01); *G09G 2310/0289* (2013.01)

(58) Field of Classification Search
CPC ... H03K 19/018528; H03K 19/018535; H03K 3/356113; H03K 3/037; H03K 19/0175; H03K 19/017509; H03K 19/0185; H03K 3/07; H03K 3/35613; H03K 3/356165; G06F 3/262; G11C 5/147; G09G 3/3258; G09G 2310/0289; G09G 3/3208; G05F 3/262
See application file for complete search history.

(56) References Cited

U.S. PATENT DOCUMENTS

| | | | |
|---|---|---|---|
| 7,053,656 B2 | 5/2006 | Seo | |
| 7,112,996 B2 | 9/2006 | Lee | |
| 7,145,363 B2 | 12/2006 | Kim | |
| 7,199,638 B2 * | 4/2007 | Dubey | H03K 19/018528 326/81 |
| 7,605,609 B1 | 10/2009 | Andrews et al. | |
| 7,679,418 B2 | 3/2010 | Vlasenko | |
| 8,836,406 B2 | 9/2014 | Wang | |
| 9,537,469 B2 | 1/2017 | Farooqi et al. | |
| 2015/0180474 A1 * | 6/2015 | Mathur | H03K 19/018521 326/81 |
| 2019/0173455 A1 * | 6/2019 | Ko | H03K 3/017 |

\* cited by examiner

LEVEL SHIFTER AND SEMICONDUCTOR DEVICE INCLUDING THE SAME AND OPERATION METHOD THEREOF

CROSS-REFERENCE TO RELATED APPLICATION

This application claims the benefit of Korean Patent Application No. 10-2019-0009244, filed on Jan. 24, 2019, in the Korean Intellectual Property Office, the disclosure of which is incorporated herein in its entirety by reference.

BACKGROUND

The inventive concept relates to a level shifter and a semiconductor device including the same, and an operation method thereof, and more particularly, to a level shifter having a wide range of an output voltage and an operation method thereof.

To operate an electronic device by receiving a voltage from the outside of the electronic device, the received voltage may be shifted to a certain level compatible with the electronic device by using a level shifter. Particularly, the level shifter satisfies compatibility between heterogeneous devices having various voltage requirements by shifting a logic level from a first voltage domain to a second voltage domain. For example, because a general level shifter has a relatively low range of a logic level as maximum 5 V or the like to be output to the second voltage domain, the general level shifter cannot be used for electronic devices demanding a voltage of a relatively high logic level.

SUMMARY

The inventive concept provides a level shifter for blocking a leakage current occurring in a current mirror even shifting to a voltage of a relatively high logic level.

According to an aspect of the inventive concept, there is provided a semiconductor device including a level shifter. The level shifter is configured to output an output voltage in response to an input voltage, the output voltage having a voltage level range different from a voltage level range of the input voltage, the level shifter including: a current mirror configured to copy a reference current flowing through a first mirror transistor to a second mirror transistor; a current mirror control circuit electrically connected to the current mirror by a sink node and including a plurality of control transistors configured to control the current mirror; and an output circuit configured to output an output voltage based on a voltage level of the sink node, wherein a first control transistor of the plurality of control transistors receives the output voltage fed back to a gate terminal of the first control transistor, and a second control transistor of the plurality of control transistors receives an inverted output voltage fed back to a gate terminal of the second control transistor.

According to another aspect of the inventive concept, there is provided an operation method of a level shifter for outputting an output voltage by receiving an input voltage, the output voltage having a voltage level range different from a voltage level range of the input voltage, the operation method including: applying the input voltage to an input inverter circuit and outputting an inverted input voltage obtained by inverting a phase of the input voltage, and a differential input voltage obtained by inverting a phase of the inverted input voltage; applying the inverted input voltage to a gate terminal of a first control transistor connected to a drain node of a current mirror; applying the differential input voltage to a gate terminal of a third control transistor connected to a sink node of the current mirror; generating an inverted output voltage based on a voltage of the sink node and outputting the output voltage by inverting the inverted output voltage; feeding back the output voltage and the inverted output voltage; applying the output voltage to a gate terminal of a second control transistor connected to the first control transistor; and applying the inverted output voltage to a gate terminal of a fourth control transistor connected to the third control transistor.

According to another aspect of the inventive concept, there is provided a semiconductor device including a level shifter. The level shifter is configured to output an output voltage in response to an input voltage, the output voltage having a voltage level range different from a voltage level range of the input voltage, the level shifter including: an input inverter circuit configured to receive the input voltage and output an inverted input voltage and a differential input voltage inverting the inverted input voltage, based on the input voltage; a current mirror including first and second mirror transistors configured to copy a current flowing through a first source/drain terminal of the first mirror transistor to a first source/drain terminal of the second mirror transistor, share a driving voltage applied to a second source/drain terminal of each of the first and second mirror transistors, and share a voltage applied to a gate terminal of each of the first and second mirror transistors; and a current mirror control circuit including a first control transistor connected to the first source/drain terminal of the first mirror transistor by a first source/drain terminal of the first control transistor, a second control transistor connected to a second source/drain terminal of the first control transistor by a first source/drain terminal of the second control transistor, a third control transistor connected to the first source/drain terminal of the second mirror transistor by a first source/drain terminal of the third control transistor, and a fourth control transistor connected to a second source/drain terminal of the third control transistor by a first source/drain terminal of the fourth control transistor, wherein the inverted input voltage is applied to a gate terminal of the first control transistor, the output voltage is fed back to a gate terminal of the second control transistor, the differential input voltage is applied to a gate terminal of the third control transistor, and an inverted output voltage is applied to a gate terminal of the fourth control transistor.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the inventive concept will be described in detail with reference to the accompanying drawings.

Figure 1:
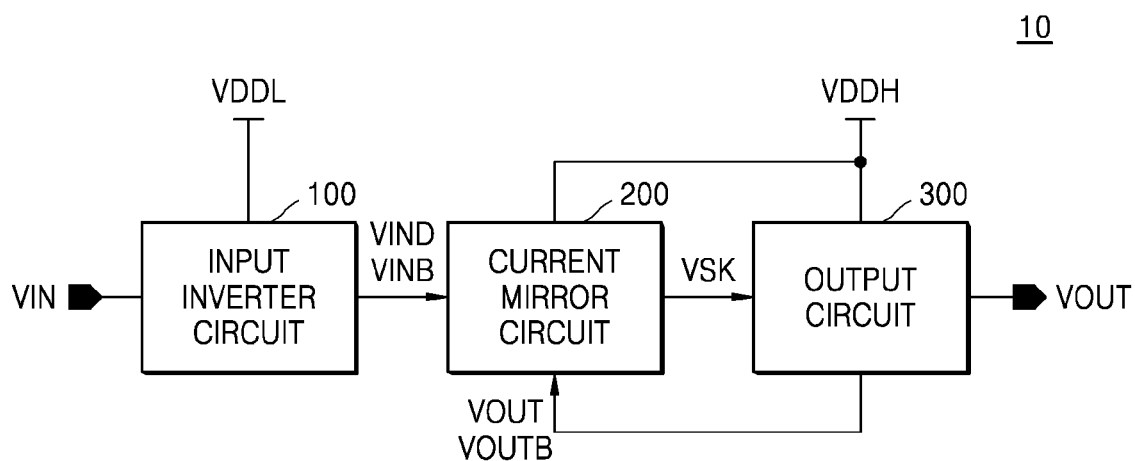
FIG. 1 is a block diagram of a level shifter according to an example embodiment of the inventive concept.

FIG. 1 is a block diagram of a level shifter 10 according to an example embodiment of the inventive concept. Herein the level shifter may be a voltage level shifter.

As used herein, a semiconductor device may refer to various items such as a memory device, one or more logic devices formed in or on a semiconductor substrate, a semiconductor chip, a memory chip, a logic chip, a package, or combinations thereof. A semiconductor device such as a semiconductor chip, a memory chip, or a logic chip may be formed from a wafer. A semiconductor device may comprise a package which may include one or more chips stacked on a package substrate, or a package-on-package device including a plurality of packages.

Referring to FIG. 1, a semiconductor device may include the level shifter 10 and the level shifter 10 may include an input inverter circuit 100, a current mirror circuit 200, and an output circuit 300.

The input inverter circuit 100 according to an embodiment of the inventive concept may receive an input voltage VIN and output a differential input voltage VIND and an inverted input voltage VINB based on the input voltage VIN. The differential input voltage VIND may have the same or similar phase and magnitude as or to those of the input voltage VIN, and the inverted input voltage VINB may have a phase obtained by inverting the phase of the input voltage VIN and have the same or similar magnitude as or to that of the input voltage VIN. The inverting may indicate, for example, leading or lagging the phase by 180 degrees. The input inverter circuit 100 may also receive an inverter driving voltage VDDL. In some examples, a voltage level of each of the differential input voltage VIND and the inverted input voltage VINB is variable depend on a voltage level of the inverter driving voltage VDDL. Thus, a voltage level of each of the differential input voltage VIND and the inverted input voltage VINB may be different from a voltage level of the input voltage VIN.

The current mirror circuit 200 according to an embodiment of the inventive concept may receive the differential input voltage VIND and the inverted input voltage VINB applied from the input inverter circuit 100 and receive an output voltage VOUT and an inverted output voltage VOUTB fed back from the output circuit 300. The inverted output voltage VOUTB may have a phase obtained by inverting a phase of the output voltage VOUT and have the same or similar magnitude as or to that of the output voltage VOUT. The current mirror circuit 200 may also receive a driving voltage VDDH. A voltage level of the driving voltage VDDH may be higher than a voltage level of the inverter driving voltage VDDL.

The current mirror circuit 200 according to an embodiment of the inventive concept may output a voltage VSK on a sink node (Hereinafter, VSK may be referred to as a sink node voltage) based on any one of the received voltages including the differential input voltage VIND, the inverted input voltage VINB, the output voltage VOUT, the inverted output voltage VOUTB, and the driving voltage VDDH. The current mirror circuit 200 may include a first mirror transistor (e.g., MP1 of FIG. 3) configured to output a current to be copied and a second mirror transistor (e.g., MP2 of FIG. 3) configured to copy a current output from the first mirror transistor and output the copied current. The sink node may include a node through which the second mirror transistor inputs or outputs a current, and a voltage of the sink node may include the sink node voltage VSK. A detailed description of the current mirror circuit 200 will be made below.

The output circuit 300 according to an embodiment of the inventive concept may output the output voltage VOUT to the outside of the level shifter 10 based on the sink node voltage VSK. The output voltage VOUT may have a logic level range different from that of the input voltage VIN. For example, the logic level range of the input voltage VIN may be greater than or equal to 0 V and less than or equal to 2 V. In this case, a logic low level of the input voltage VIN may be 0 V and a logic high level of the input voltage VIN may be 2 V. In some examples, a logic low level of the input voltage VIN may have a logic low level range and a logic high level of the input voltage VIN may have a logic high level range. In addition, the logic level range of the output voltage VOUT may be greater than or equal to 0 V and less than or equal to 30 V. In this case, a logic low level of the output voltage VOUT may be 0 V and a logic high level of the output voltage VOUT may be 30 V. In some examples, a logic low level of the output voltage VOUT may have a logic low level range and a logic high level of the output voltage VOUT may have a logic high level range. Accordingly, the level shifter 10 may shift a logic level range of a first domain (e.g., a domain in which power is supplied) to a logic level range of a second domain (e.g., a domain in which power is consumed). The output circuit 300 may output the output voltage VOUT and the inverted output voltage VOUTB to the current mirror circuit 200 based on the sink node voltage VSK.

According to an embodiment of the inventive concept, the level shifter 10 may output the sink node voltage VSK having a higher voltage level than the input voltage VIN and output the output voltage VOUT obtained by enlarging the logic level range of the input voltage VIN based on the sink node voltage VSK.

Figure 2:
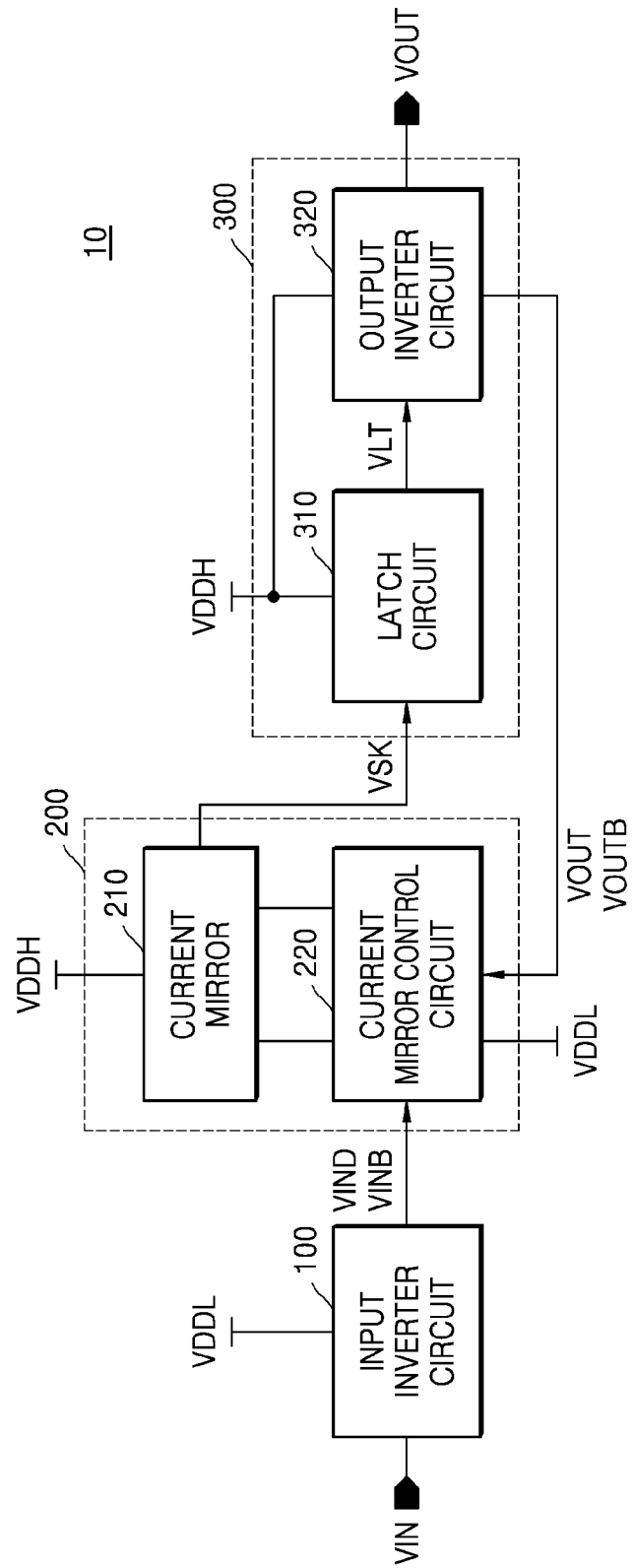
FIG. 2 is a block diagram of a current mirror circuit and an output circuit of the level shifter according to an example embodiment of the inventive concept.

FIG. 2 is a block diagram of the current mirror circuit 200 and the output circuit 300 of the level shifter 10 according to an example embodiment of the inventive concept.

Referring to FIGS. 1 and 2, the current mirror circuit 200 may include a current mirror 210 and a current mirror control circuit 220, and the output circuit 300 may include a latch circuit 310 and an output inverter circuit 320.

The current mirror 210 according to an embodiment of the inventive concept may output the sink node voltage VSK having a particular logic level. The sink node voltage VSK may include a logic low level and a logic high level. For example, the current mirror 210 may output the sink node voltage VSK based on a ground voltage VSS without copying a current, and the sink node voltage VSK may have the logic low level. As another example, the current mirror 210 may copy a current and output the sink node voltage VSK based on the copied current, and the sink node voltage VSK may have the logic high level. Hereinafter, the meaning that the current mirror 210 copies a current may indicate, for example, that a second mirror transistor of the current mirror 210 outputs a current having the same current amount as that of a current output from a first mirror transistor of the current mirror 210. As another example, the meaning that the current mirror 210 copies a current may indicate that the second mirror transistor outputs a current amount obtained by multiplying a current amount output from the first mirror transistor by a certain gain value.

The current mirror control circuit 220 according to an embodiment of the inventive concept may include a plurality of control transistors (MN1 to MN4 of FIG. 3) electrically connected to the current mirror 210 by a sink node (SK of FIG. 3) and configured to control the current mirror 210. In detail, the current mirror control circuit 220 may create or block a current path such that the current mirror 210 copies or does not copy a current. For example, the current mirror control circuit 220 may control the current mirror 210 by using the plurality of control transistors such that the current mirror 210 copies or does not copy a current.

The current mirror control circuit 220 may create or block a current path based on a plurality of voltages including the differential input voltage VIND, the inverted input voltage VINB, the output voltage VOUT, and the inverted output voltage VOUTB. For example, in the current mirror control circuit 220, the differential input voltage VIND, the inverted input voltage VINB, the output voltage VOUT, and the inverted output voltage VOUTB may be fed back to respective gate terminals of the plurality of control transistors. The plurality of control transistors may be turned on or off based on the respective voltages input to the gate terminals thereof to create or block a current path.

The latch circuit 310 according to an embodiment of the inventive concept may receive the sink node voltage VSK and output a latch output voltage VLT having a phase inverted from a phase of the sink node voltage VSK. In addition, the latch circuit 310 may latch the voltage level of the sink node voltage VSK so as not to be changed.

According to an embodiment of the inventive concept, when the sink node voltage VSK having the logic low level is applied to the latch circuit 310, the latch circuit 310 may latch the sink node voltage VSK to the same level as that of the ground voltage VSS and output the latch output voltage VLT having a logic high level. In this case, a voltage level of the latch output voltage VLT may be decided based on a voltage level of the driving voltage VDDH.

According to another embodiment of the inventive concept, when the sink node voltage VSK having the logic high level is applied to the latch circuit 310, the latch circuit 310 may latch the sink node voltage VSK to the same level as that of the driving voltage VDDH and output the latch output voltage VLT having a logic low level. In this case, a voltage level of the latch output voltage VLT may be decided based on the ground voltage VSS.

The output inverter circuit 320 according to an embodiment of the inventive concept may output the inverted output voltage VOUTB obtained by inverting a phase of the latch output voltage VLT, and the output voltage VOUT obtained by inverting a phase of the inverted output voltage VOUTB.

Figure 3:
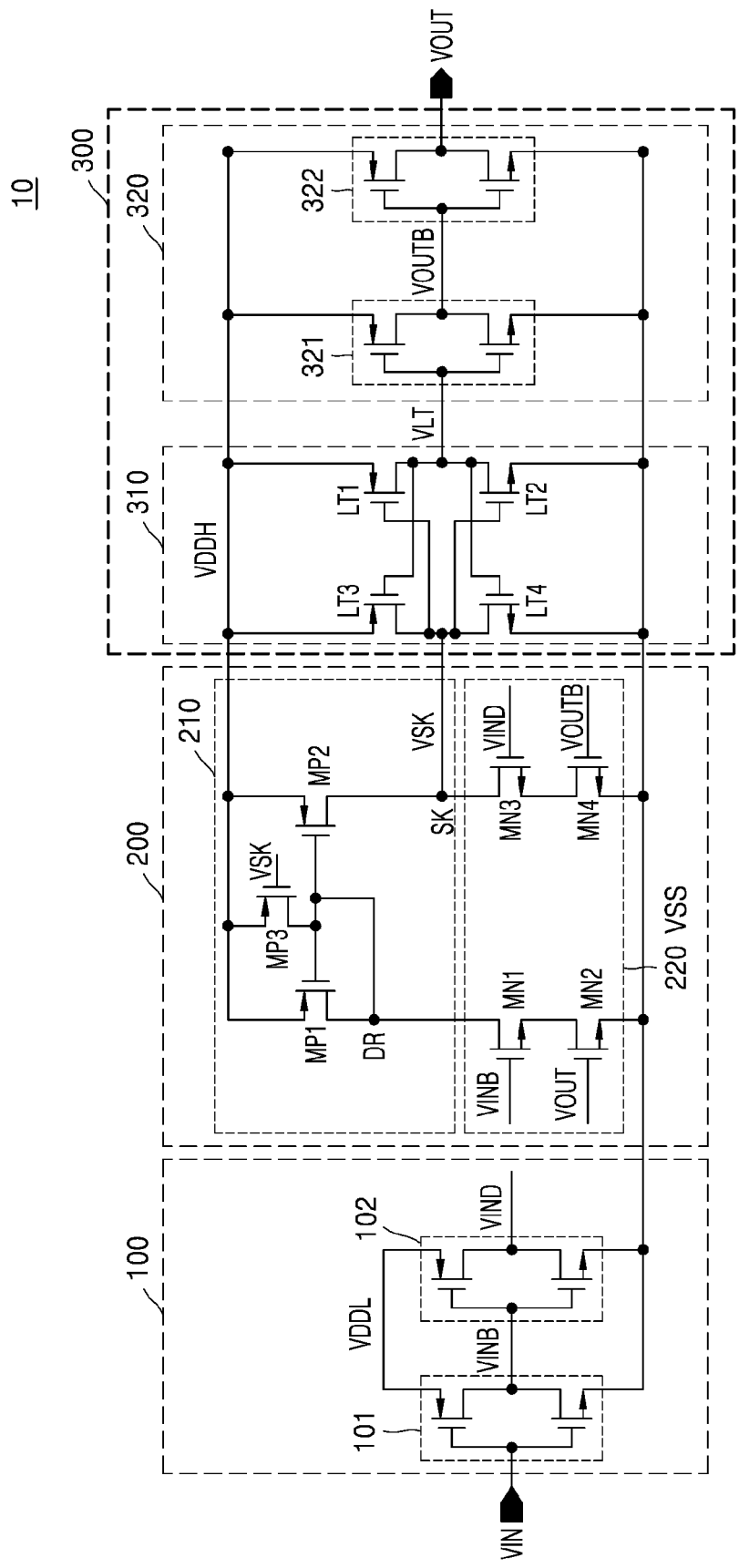
FIG. 3 is a circuit diagram of the level shifter according to an example embodiment of the inventive concept.

FIG. 3 is a circuit diagram of the level shifter 10 according to an example embodiment of the inventive concept.

Referring to FIG. 3, the input inverter circuit 100 may include a first input inverter 101 and a second input inverter 102. The input inverter circuit 100 may reduce a transition time of the input voltage VIN. For example, when the input voltage VIN transitions from the logic low level to the logic high level, the input inverter circuit 100 may output the inverted input voltage VINB and the differential input voltage VIND having short transition times by reducing the transition time of the input voltage VIN according to decision levels which the first input inverter 101 and the second input inverter 102 have.

According to an embodiment of the inventive concept, the first input inverter 101 may output the inverted input voltage VINB having the logic high level by inverting the input voltage VIN having the logic low level, and vice versa.

According to an embodiment of the inventive concept, the second input inverter 102 may output the differential input voltage VIND having a logic low level by inverting the inverted input voltage VINB having the logic high level, and vice versa. For example, the differential input voltage VIND is a voltage obtained by inverting the input voltage VIN twice, and thus, the differential input voltage VIND and the input voltage VIN may have the same phase and magnitude. The reason why the differential input voltage VIND is output by using the second input inverter 102 is to reduce a relatively long transition time which the input voltage VIN has.

Referring to FIG. 3, each of the first input inverter 101 and the second input inverter 102 may include a p-channel metal oxide semiconductor (PMOS) transistor and an n-channel metal oxide semiconductor (NMOS) transistor, the inverter driving voltage VDDL may be applied to the PMOS transistor, and the ground voltage VSS may be applied to the NMOS transistor. However, the input inverter circuit 100 is not limited to this circuit configuration, and the input inverter circuit 100 may include various forms of circuit configurations capable of outputting the inverted input voltage VINB obtained by inverting the input voltage VIN, and the differential input voltage VIND obtained by inverting the inverted input voltage VINB.

In some examples, a logic low level of the inverted input voltage VINB may be the same as a logic low level of the differential input voltage VIND, and a logic high level of the inverted input voltage VINB may be the same as a logic high level of the differential input voltage VIND. Herein, the logic low level of each of the inverted input voltage VINB and the differential input voltage VIND may be indicated as 'logic low,' and the logic high level of each of the inverted input voltage VINB and the differential input voltage VIND may be indicated as 'logic high'.

The current mirror 210 may include a plurality of transistors and may copy a current output from a source/drain terminal of one of the plurality of transistors and output the copied current to a source/drain terminal of another one of the plurality of transistors.

According to an embodiment of the inventive concept, the current mirror 210 may include a first mirror transistor MP1, a second mirror transistor MP2, and a third mirror transistor MP3.

Referring to FIG. 3, a first source/drain terminal (e.g., drain terminal) of the first mirror transistor MP1 may be electrically connected to a gate terminal of the first mirror transistor MP1 and a gate terminal of the second mirror transistor MP2 through a drain node DR. In addition, a second source/drain terminal (e.g., source terminal) of the first mirror transistor MP1 and a second source/drain terminal (e.g., source terminal) of the second mirror transistor MP2 may be connected to the driving voltage VDDH.

The third mirror transistor MP3 may be included in the current mirror 210 such that a node to which the gate terminal of the first mirror transistor MP1 and the gate terminal of the second mirror transistor MP2 are connected does not float. The third mirror transistor MP3 may operate by receiving the sink node voltage VSK fed back to a gate terminal of the third mirror transistor MP3. The third mirror transistor MP3 may be described below with reference to FIGS. 4 and 5. The sink node voltage VSK may have a voltage level increasing by an equivalent capacitor connected in parallel to a sink node SK, and the sink node voltage VSK may drop to the logic low level. The sink node voltage VSK may be described below with reference to FIG. 5.

According to an embodiment of the inventive concept, the current mirror control circuit 220 may include a plurality of control transistors, e.g., first to fourth control transistors, MN1, MN2, MN3, and MN4.

The first control transistor MN1 may receive the inverted input voltage VINB output from the input inverter circuit 100, applied to a gate terminal of the first control transistor MN1, and a second source/drain terminal of the first control transistor MN1 may be connected to the drain node DR. For example, the second source/drain terminal of the first control transistor MN1 may be electrically connected to the first source/drain terminal of the first mirror transistor MP1, the gate terminal of the first mirror transistor MP1, and the gate terminal of the second mirror transistor MP2 through the drain node DR.

The second control transistor MN2 may receive the output voltage VOUT output from the output circuit 300, fed back to a gate terminal of the second control transistor MN2. A second source/drain terminal of the second control transistor MN2 may be electrically connected to a first source/drain terminal of the first control transistor MN1. In addition, a first source/drain terminal of the second control transistor MN2 may be connected to a node of the ground voltage VSS.

The third control transistor MN3 may receive the differential input voltage VIND from the input inverter circuit 100, fed back to a gate terminal of the third control transistor MN3. A second source/drain terminal of the third control transistor MN3 may be connected to the sink node SK. For example, the third control transistor MN3 may be electrically connected to the second mirror transistor MP2 through the sink node SK.

The fourth control transistor MN4 may receive the inverted output voltage VOUTB from the output circuit 300, fed back to a gate terminal of the fourth control transistor MN4. A second source/drain terminal of the fourth control transistor MN4 may be electrically connected to a first source/drain terminal of the third control transistor MN3. In addition, a first source/drain terminal of the fourth control transistor MN4 may be connected to the node of the ground voltage VSS.

According to an embodiment of the inventive concept, the latch circuit 310 may latch the applied sink node voltage VSK such that a level of the sink node voltage VSK is not changed. That is, the latch circuit 310 may operate so as to stably maintain the sink node voltage VSK.

According to an embodiment of the inventive concept, the sink node voltage VSK may have the logic low level. In this case, a voltage of the logic low level may be applied to gate terminals of a first latch transistor LT1 and a second latch transistor LT2, and accordingly, the first latch transistor LT1 may be turned on, and the second latch transistor LT2 may be turned off. The driving voltage VDDH applied to a second source/drain terminal of the first latch transistor LT1 turned on may be applied to a first source/drain terminal of the first latch transistor LT1.

In this case, the latch output voltage VLT that is a voltage of the first source/drain terminal of the first latch transistor LT1 may have a level of the driving voltage VDDH. For example, although the applied sink node voltage VSK has the logic low level, the latch output voltage VLT may have the level of the driving voltage VDDH, i.e., the logic high level.

Meanwhile, the driving voltage VDDH may also be applied to a gate terminal of a fourth latch transistor LT4 electrically connected to the first source/drain terminal of the first latch transistor LT1, such that the fourth latch transistor LT4 is turned on. Accordingly, the sink node voltage VSK may have the same level as that of the ground voltage VSS by the fourth latch transistor LT4 turned on. For example, when the sink node voltage VSK having the logic low level is applied to the latch circuit 310, the sink node voltage VSK may be latched to a level of the ground voltage VSS by an operation of the latch circuit 310.

When the sink node voltage VSK has the logic high level, for the same principle as described above, the sink node voltage VSK may be latched to the same level as that of the driving voltage VDDH. In addition, a voltage of the logic high level may be applied to the gate terminals of the first latch transistor LT1 and the second latch transistor LT2, and accordingly, the first latch transistor LT1 may be turned off, and the second latch transistor LT2 may be turned on. The ground voltage VSS applied to a first source/drain terminal of the second latch transistor LT2 turned on may be applied to a second source/drain terminal of the second latch transistor LT2.

In this case, the latch output voltage VLT that is a voltage of the second source/drain terminal of the second latch transistor LT2 may have the level of the ground voltage VSS. For example, although the applied sink node voltage VSK has the logic high level, the latch output voltage VLT may have the level of the ground voltage VSS, i.e., the logic low level.

The output inverter circuit 320 according to an embodiment of the inventive concept may include a plurality of output inverters, e.g., first and second output inverters 321 and 322. The first and second output inverters 321 and 322 may reduce a transition time of the latch output voltage VLT. For example, the output inverter circuit 320 may reduce the transition time of the latch output voltage VLT by generating the output voltage VOUT obtained by inverting the transition time of the latch output voltage VLT twice.

According to an embodiment of the inventive concept, the first output inverter 321 may output the inverted output voltage VOUTB having a logic high level by inverting the latch output voltage VLT having the logic low level, and vice versa.

According to an embodiment of the inventive concept, the second output inverter 322 may output the output voltage VOUT having a logic low level by inverting the inverted output voltage VOUTB having the logic high level, and vice versa.

Meanwhile, the output inverter circuit 320 may apply the output voltage VOUT and the inverted output voltage VOUTB to the current mirror control circuit 220. In addition, the output inverter circuit 320 has a similar configuration and operation to those of the input inverter circuit 100, and thus, the similar configuration and operation will not be described again.

According to an embodiment of the inventive concept, the plurality of transistors included in the input inverter circuit 100 may be low voltage (LV) transistors, and the plurality of transistors included in the current mirror circuit 200 and the output circuit 300 may be high voltage (HV) transistors, because a level of the inverter driving voltage VDDL applied to the input inverter circuit 100 is lower than the level of the driving voltage VDDH. In this case, a size of a transistor in the input inverter circuit 100 may be smaller than a size of a transistor in the current mirror circuit 200 and the output circuit 300.

A plurality of mirror transistors, i.e., the first to third mirror transistors MP1 to MP3, and some latch transistors, i.e., first and third latch transistors LT1 and LT3, may be PMOSs, and a plurality of control transistors, i.e., the first to fourth control transistors MN1 to MN4, and the other latch transistors, i.e., second and fourth latch transistors LT2 and LT4, may be NMOSs. In addition, among transistors included in the output inverter circuit 320, transistors connected to a node of the driving voltage VDDH may be PMOSs, and transistors connected to the node of the ground voltage VSS may be NMOSs.

In some examples, a logic low level of each of the sink node voltage VSK, the latch output voltage VLT, the inverted output voltage VOUTB, and the output voltage VOUT may be the same as each other, and a logic high level of each of the sink node voltage VSK, the latch output voltage VLT, the inverted output voltage VOUTB, and the output voltage VOUT may be the same as each other. Herein, the logic low level of each of the sink node voltage VSK, the latch output voltage VLT, the inverted output voltage VOUTB, and the output voltage VOUT may be indicated as 'logic low,' and the logic high level of each of the sink node voltage VSK, the latch output voltage VLT, the inverted output voltage VOUTB, and the output voltage VOUT may be indicated as 'logic high'.

FIGS. 4 to 8 are circuit diagrams for describing the level shifter 10 when an input voltage having the logic low level or the logic high level is applied thereto. 'H' used in FIGS. 4 to 8 indicates that a corresponding voltage or a voltage of a corresponding terminal has the logic high level, and 'L' used therein indicates that a corresponding voltage or a voltage of a corresponding terminal has the logic low level. In addition, the level shifter 10 may generate the sink node voltage VSK obtained by inverting a phase of the input voltage VIN or the differential input voltage VIND, generate the latch output voltage VLT obtained by inverting a phase of the sink node voltage VSK, generate the inverted output voltage VOUTB obtained by inverting a phase of the latch output voltage VLT, and output the output voltage VOUT obtained by inverting a phase of the inverted output voltage VOUTB. For convenience of description, the input inverter circuit 100 is not shown in FIGS. 4 to 8.

Figure 9:
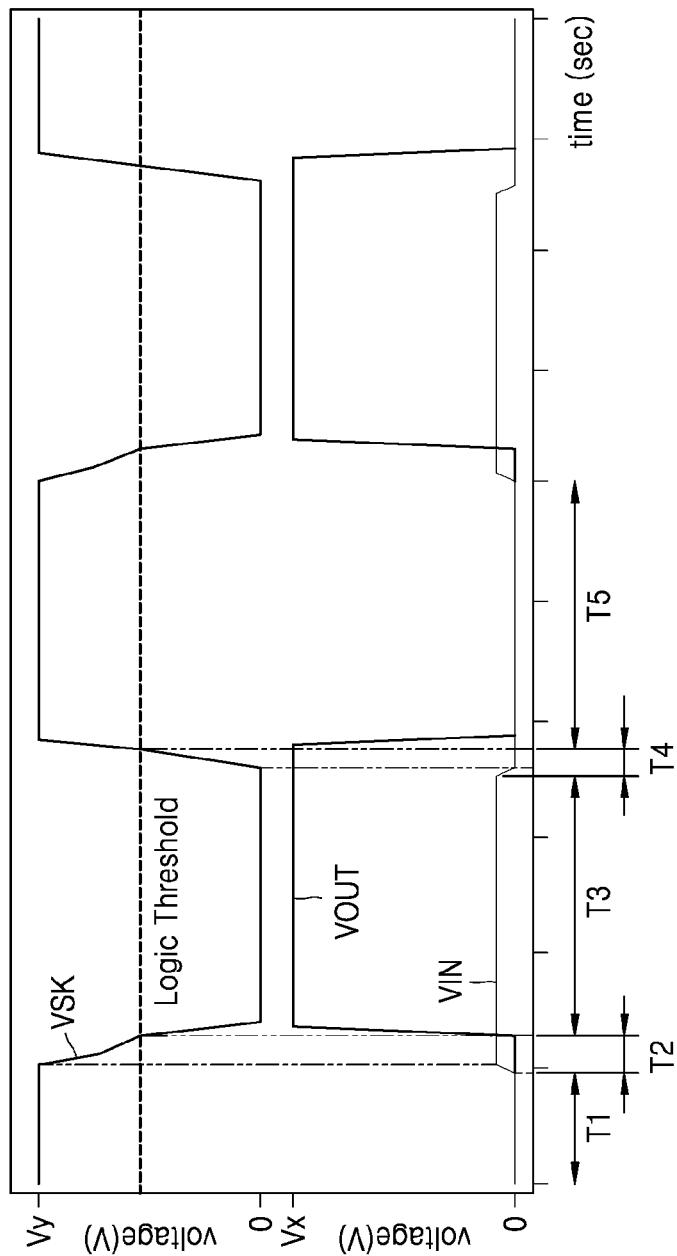
FIG. 9 is a waveform diagram of an input voltage, an output voltage, and a sink node voltage of the level shifter according to an example embodiment of the inventive concept.

FIG. 9 is a waveform diagram of the input voltage VIN, the output voltage VOUT, and the sink node voltage VSK of the level shifter 10 according to an example embodiment of the inventive concept. Referring to FIG. 9, the horizontal axis indicates time and the vertical axis indicates voltage levels of the input voltage VIN, the output voltage VOUT, and the sink node voltage VSK.

Figure 4:
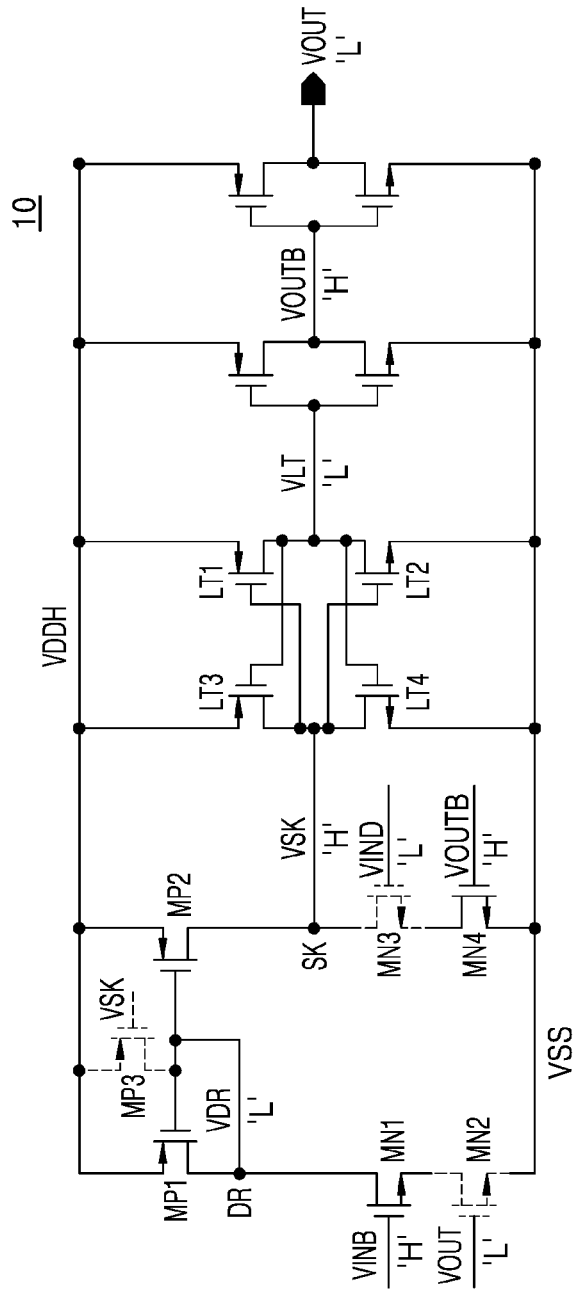
FIG. 4 is a circuit diagram of the level shifter when an input voltage having a logic low level is applied thereto, according to an example embodiment of the inventive concept.

Referring to FIGS. 4 and 9, in a time period T1, a voltage of the logic high level is applied to the gate terminals of the first control transistor MN1 and the fourth control transistor MN4, and the first control transistor MN1 and the fourth control transistor MN4 may be turned on. In addition, a voltage of the logic low level is applied to the gate terminals of the second control transistor MN2 and the third control transistor MN3, and the second control transistor MN2 and the third control transistor MN3 may be turned off.

The sink node voltage VSK may have the same level as that of the driving voltage VDDH applied through the second source/drain terminal of the second mirror transistor MP2. That is, the sink node voltage VSK may have the logic high level.

In addition, the sink node voltage VSK having the logic high level may be applied to the gate terminal of the third mirror transistor MP3, and the third mirror transistor MP3 may be turned off. Accordingly, a drain node voltage VDR may have the logic low level. This case will be described below with reference to FIG. 8.

Referring to FIGS. 3 and 4, the latch circuit 310 may output the latch output voltage VLT obtained by inverting a phase of the sink node voltage VSK. That is, the latch output voltage VLT may have the logic low level. In addition, the first output inverter 321 and the second output inverter 322 may respectively output the inverted output voltage VOUTB having the logic high level and the output voltage VOUT having the logic low level.

In some examples, the latch output voltage VLT may have the logic high by a predetermined fixed voltage during a power up of a semiconductor device including the level shifter 10. When the input voltage VIN transitioning the logic low to the logic high is applied after power up, the drain node voltage VDR may have the logic low in response to the inverted input voltage VINB having the logic high and the output voltage VOUT having the logic high.

Figure 5:
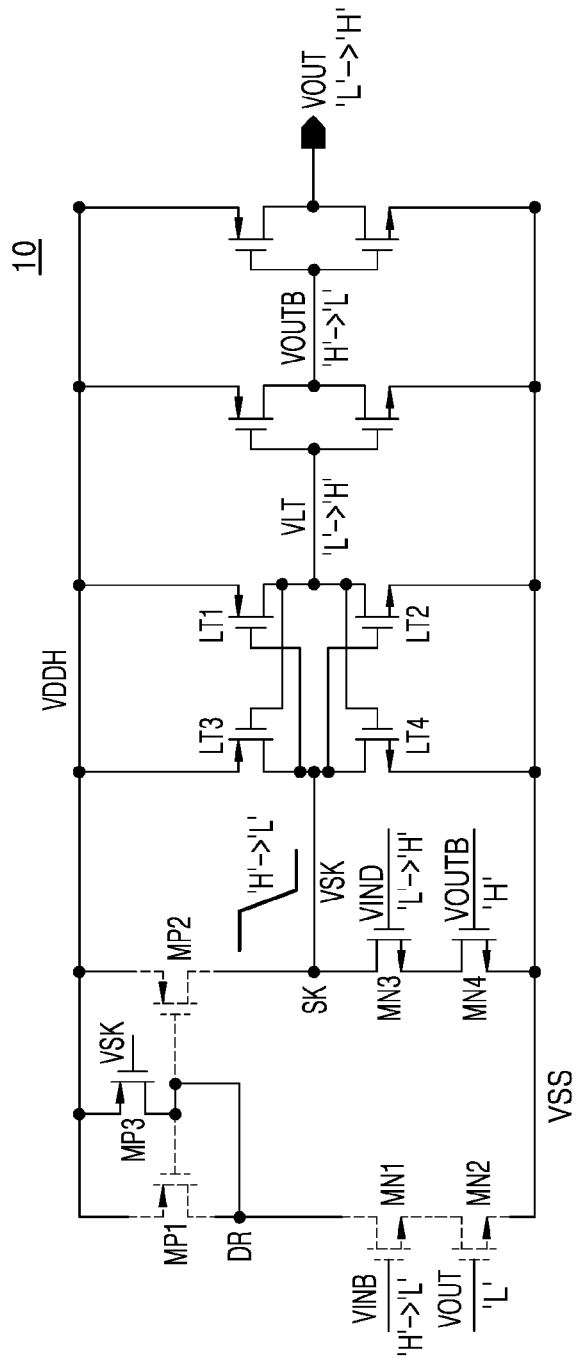
FIG. 5 is a circuit diagram of the level shifter when an input voltage transitioning from the logic low level to a logic high level is applied thereto, according to an example embodiment of the inventive concept.

FIG. 5 is a circuit diagram of the level shifter 10 when an input voltage transitioning from the logic low level to the logic high level is applied thereto, according to an example embodiment of the inventive concept.

Referring to FIGS. 5 and 9, in a time period T2, the input voltage VIN transitioning from the logic low level to the logic high level may be applied to the input inverter circuit 100 of FIG. 3. The input inverter circuit 100 may apply the differential input voltage VIND transitioning from the logic low level to the logic high level to the third control transistor MN3. In addition, the input inverter circuit 100 may apply the inverted input voltage VINB transitioning from the logic high level to the logic low level to the first control transistor MN1. Accordingly, the first control transistor MN1 may be turned off, and the third control transistor MN3 may be turned on.

The turn-off of the first control transistor MN1 may perfectly block flow of a current from the drain node DR to the node of the ground voltage VSS. In addition, the turn-on of the third control transistor MN3 may cause forming a current path from the sink node SK to the node of the ground voltage VSS by passing through the third control transistor MN3 and the fourth control transistor MN4. Accordingly, the sink node voltage VSK may transit from the logic high level to the logic low level.

According to the transition of the sink node voltage VSK to the logic low level, the third mirror transistor MP3 may be turned on. In this case, the driving voltage VDDH may be applied to the drain node DR by the third mirror transistor MP3. Accordingly, the gate terminals of the first and second mirror transistors MP1 and MP2 may be fixed to the level of the driving voltage VDDH, i.e., the logic high level, such that the gate terminals of the first and second mirror transistors MP1 and MP2 are not floated. Meanwhile, the second mirror transistor MP2 may be turned off so as to prevent the driving voltage VDDH from being applied to the sink node SK and to enable the sink node voltage VSK to drop to the logic low level.

Referring to FIGS. 3 and 5, according to an embodiment of the inventive concept, in response to the transition of the sink node voltage VSK to the logic low level, the latch circuit 310 may output the latch output voltage VLT having the logic high level, the first output inverter 321 may output the inverted output voltage VOUTB having the logic low level, and the second output inverter 322 may output the output voltage VOUT having the logic high level.

Referring to FIGS. 3 and 9, in the time period T2, after the input voltage VIN transitions to the logic high level, the sink node voltage VSK starts dropping to the logic low level. When the sink node voltage VSK approaches to a logic threshold voltage of the latch transistors LT1 to LT4, turned-on transistors included in the output circuit 300 are turned off, and turned-off transistors included in the output circuit 300 are turned on, thereby starting the output voltage VOUT to transition.

Herein, the logic threshold voltage indicates a threshold voltage at which an operating state of the output circuit 300 is changed, and may indicate, for example, a threshold voltage of the first to fourth latch transistors LT1 to LT4 of the latch circuit 310, a decision level of the first output inverter 321 and the second output inverter 322, and a threshold voltage of the plurality of transistors included in the output inverter circuit 320.

Figure 6:
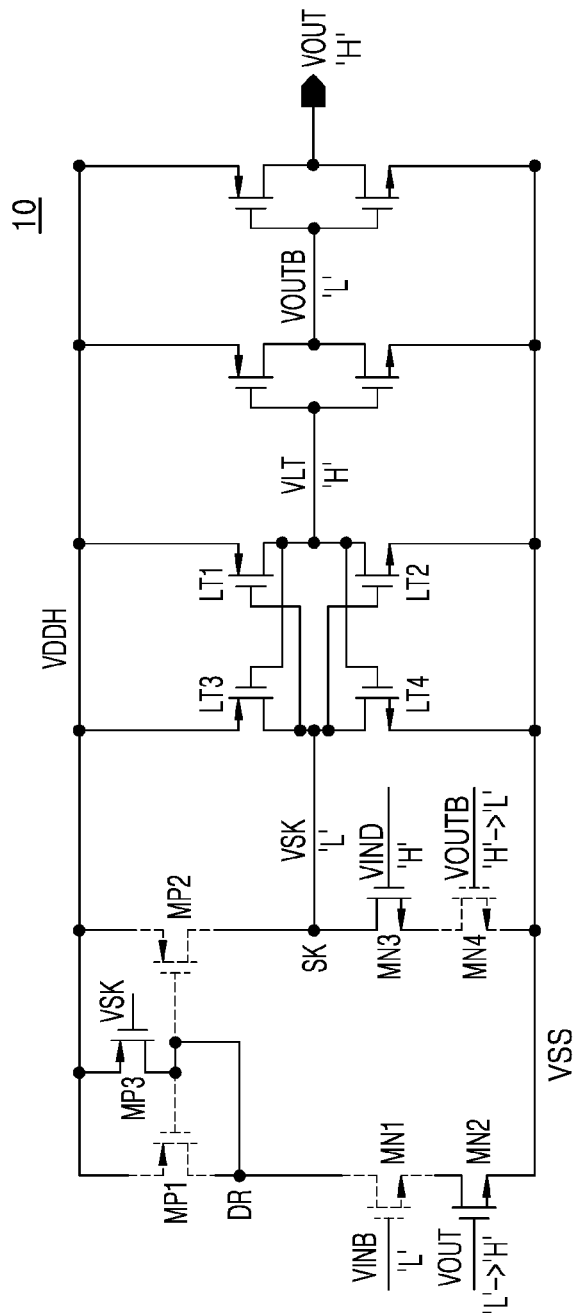
FIG. 6 is a circuit diagram of the level shifter when an input voltage having the logic high level is applied thereto, according to an example embodiment of the inventive concept.

FIG. 6 is a circuit diagram of the level shifter 10 when an input voltage having the logic high level is applied thereto, according to an example embodiment of the inventive concept.

Referring to FIGS. 3, 6 and 9, after the input voltage VIN having the logic high level is applied to the input inverter circuit 100, the output voltage VOUT may have the logic high level. The output circuit 300 may feed the output voltage VOUT having the logic high level and the inverted output voltage VOUTB having the logic low level back to the current mirror control circuit 220.

Referring to FIG. 6, the inverted output voltage VOUTB having the logic low level may be applied to the gate terminal of the fourth control transistor MN4, and the fourth control transistor MN4 may be turned off. According to the turn-off of the fourth control transistor MN4, a current path from the sink node SK to the node of the ground voltage VSS may be blocked. The output voltage VOUT having the logic high level may be applied to the gate terminal of the second control transistor MN2, and the second control transistor MN2 may be turned on.

Referring to FIGS. 6 and 9, in a time period T3, when the input voltage VIN having the logic high level is applied to the input inverter circuit 100 of FIG. 3, at least one of the first control transistor MN1 and the second control transistor MN2 may be turned off. For example, after the first control transistor MN1 to which the inverted input voltage VINB having the logic low level is applied is turned off, the second control transistor MN2 to which the fed-back output voltage VOUT having the logic high level may be turned on.

Accordingly, when the input voltage VIN transitions from the logic low level to the logic high level (e.g., time periods T1 to T3), the current path from the drain node DR to the node of the ground voltage VSS may be always blocked to prevent a leakage current flowing from the drain node DR to the node of the ground voltage VSS, and the leakage current may be copied to prevent the sink node voltage VSK from having a non-desired toggle component.

Figure 7:
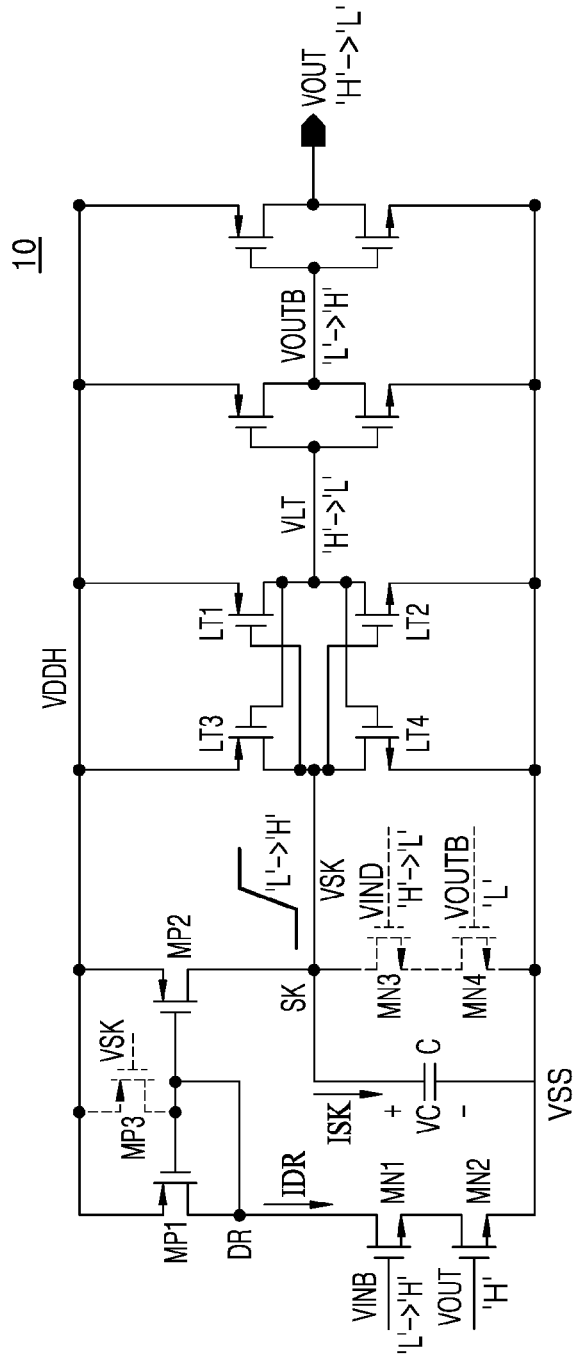
FIG. 7 is a circuit diagram of the level shifter when an input voltage transitioning from the logic high level to the logic low level is applied thereto, according to an example embodiment of the inventive concept.

FIG. 7 is a circuit diagram of the level shifter 10 when an input voltage transitioning from the logic high level to the logic low level is applied thereto, according to an example embodiment of the inventive concept.

Referring to FIGS. 3, 7 and 9, in a time period T4, the input voltage VIN transitioning from the logic high level to the logic low level may be applied to the input inverter circuit 100. The input inverter circuit 100 may apply the differential input voltage VIND transitioning from the logic high level to the logic low level to the third control transistor MN3. In addition, the input inverter circuit 100 may apply the inverted input voltage VINB transitioning from the logic low level to the logic high level to the first control transistor MN1. Accordingly, the first control transistor MN1 may be turned on, and the third control transistor MN3 may be turned off. When the first control transistor MN1 is turned on, the second control transistor MN2 is turned on during a particular period of time before the output voltage VOUT feeds back to the second control transistor MN2.

When the first control transistor MN1 is turned on, the drain node DR may be electrically connected to the node of the ground voltage VSS through the first and second control transistors MN1 and MN2, and a voltage of the drain node DR may have the level of the ground voltage VSS (i.e., the logic low level). In response to applying a voltage having the logic low level to the gate terminal of the first mirror transistor MP1 and the second mirror transistor MP2, the first mirror transistor MP1 and the second mirror transistor MP2 may be turned on. Accordingly, the current mirror 210 may copy a current IDR flowing from the drain node DR to the first control transistor MN1.

The current mirror 210 may output a current ISK copied from the sink node SK and output the copied current ISK to a capacitor C connected between the node of the ground voltage VSS and the sink node SK. In this case, a voltage VC between both ends of the capacitor C may be the same as the sink node voltage VSK. Therefore, the current mirror 210 may boost the sink node voltage VSK by outputting the copied current ISK from the sink node SK to the capacitor C.

The capacitor C may be a parasitic capacitor. For example, referring to FIG. 7, the capacitor C may have an equivalent capacitance value indicated when viewing the second latch transistor LT2 and the third latch transistor LT3 from the sink node SK. However, the capacitor C is not limited thereto and may have an equivalent capacitance value indicated in a current leaked path from the sink node SK.

In response to the transition of the sink node voltage VSK to the logic high level, the third mirror transistor MP3 may be turned off. In this case, the third mirror transistor MP3 may be turned off, and the first and second mirror transistors MP1 and MP2 may be turned on, such that the current mirror 210 may copy the current IDR output from the drain node DR.

According to an embodiment of the inventive concept, in response to the transition of the sink node voltage VSK to the logic high level, the latch circuit 310 may output the latch output voltage VLT having the logic low level, the first output inverter 321 may output the inverted output voltage VOUTB having the logic high level, and the second output inverter 322 may output the output voltage VOUT having the logic low level.

Referring to FIG. 9, in the time period T4, after the input voltage VIN transitions to the logic low level, the sink node voltage VSK starts transition to the logic high level. When the sink node voltage VSK approaches to the logic threshold voltage, turned-on transistors included in the output circuit 300 are turned off, and turned-off transistors included in the output circuit 300 are turned on, thereby starting the output voltage VOUT to drop.

Figure 8:
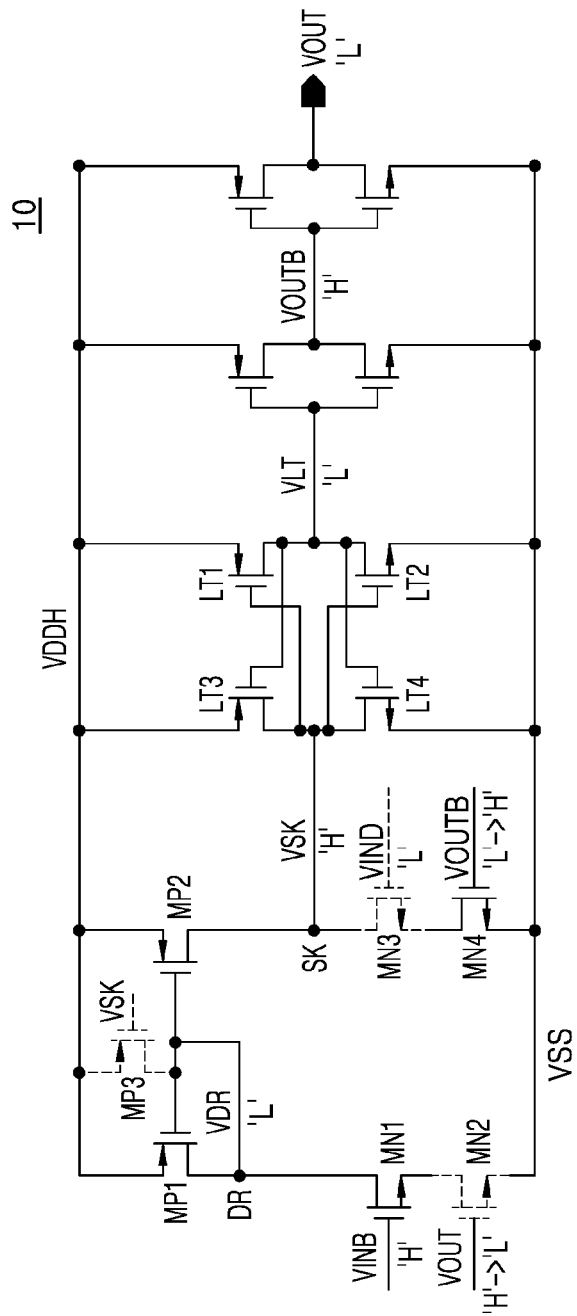
FIG. 8 is a circuit diagram of the level shifter when an input voltage having the logic low level is applied thereto, according to an example embodiment of the inventive concept.

FIG. 8 is a circuit diagram of the level shifter 10 when an input voltage having the logic low level is applied thereto, according to an example embodiment of the inventive concept;

Referring to FIGS. 3, 8 and 9, in a time period T5, after the input voltage VIN having the logic low level is applied to the input inverter circuit 100, the output voltage VOUT may have the logic low level. The output circuit 300 may feed the output voltage VOUT having the logic low level and the inverted output voltage VOUTB having the logic high level back to the current mirror control circuit 220.

Referring to FIG. 8, the output voltage VOUT having the logic low level may be applied to the gate terminal of the second control transistor MN2, and the current mirror 210 may no longer copy a current, and the sink node voltage VSK may be electrically connected to the node of the driving voltage VDDH to maintain the logic high level.

In addition, the drain node voltage VDR may gradually drop by the node of the ground voltage VSS in a state where both the first and second control transistors MN1 and MN2 are turned on, and when the second control transistor MN2 is turned off, the drain node voltage VDR may be maintained at the logic low level.

After the operation described above with reference to FIG. 8 is finished, the operation described above with reference to FIG. 4 may start, and when the input voltage VIN having the logic low level or the logic high level is periodically applied, the operations described above with reference to FIGS. 4 to 8 may be periodically repeated.

FIG. 9 is a waveform diagram of the input voltage VIN, the output voltage VOUT, and the sink node voltage VSK of the level shifter 10 according to an example embodiment of the inventive concept.

According to an embodiment of the inventive concept, the logic low level of the input voltage VIN, the output voltage VOUT, and the sink node voltage VSK may be the level of the ground voltage VSS. The level of the ground voltage VSS may include zero volt (0 V). The logic high level of the output voltage VOUT may include a level Vx shown in FIG. 9 and may be higher than the logic high level of the input voltage VIN. In addition, the logic high level of the output voltage VOUT may include the level of the driving voltage VDDH. The logic high level of the sink node voltage VSK may include a level Vy shown in FIG. 9 and may include the level of the driving voltage VDDH.

According to an embodiment of the inventive concept, in the time period T1, both the input voltage VIN and the output voltage VOUT have the logic low level, and the sink node voltage VSK has the logic high level. In the time period T2, the input voltage VIN transitions to the logic high level, the output voltage VOUT maintains the logic low level, and the sink node voltage VSK drops to the logic threshold voltage. In the time period T3, the input voltage VIN has the logic high level, the output voltage VOUT transitions to the logic high level, and the sink node voltage VSK transitions to the logic low level. In the time period T4, the input voltage VIN transitions to the logic low level, the output voltage VOUT maintains the logic high level, and the sink node voltage VSK is boosted to the logic threshold voltage. In the time period T5, the output voltage VOUT maintains the logic low level, and the sink node voltage VSK maintains the logic high level.

Figure 10:
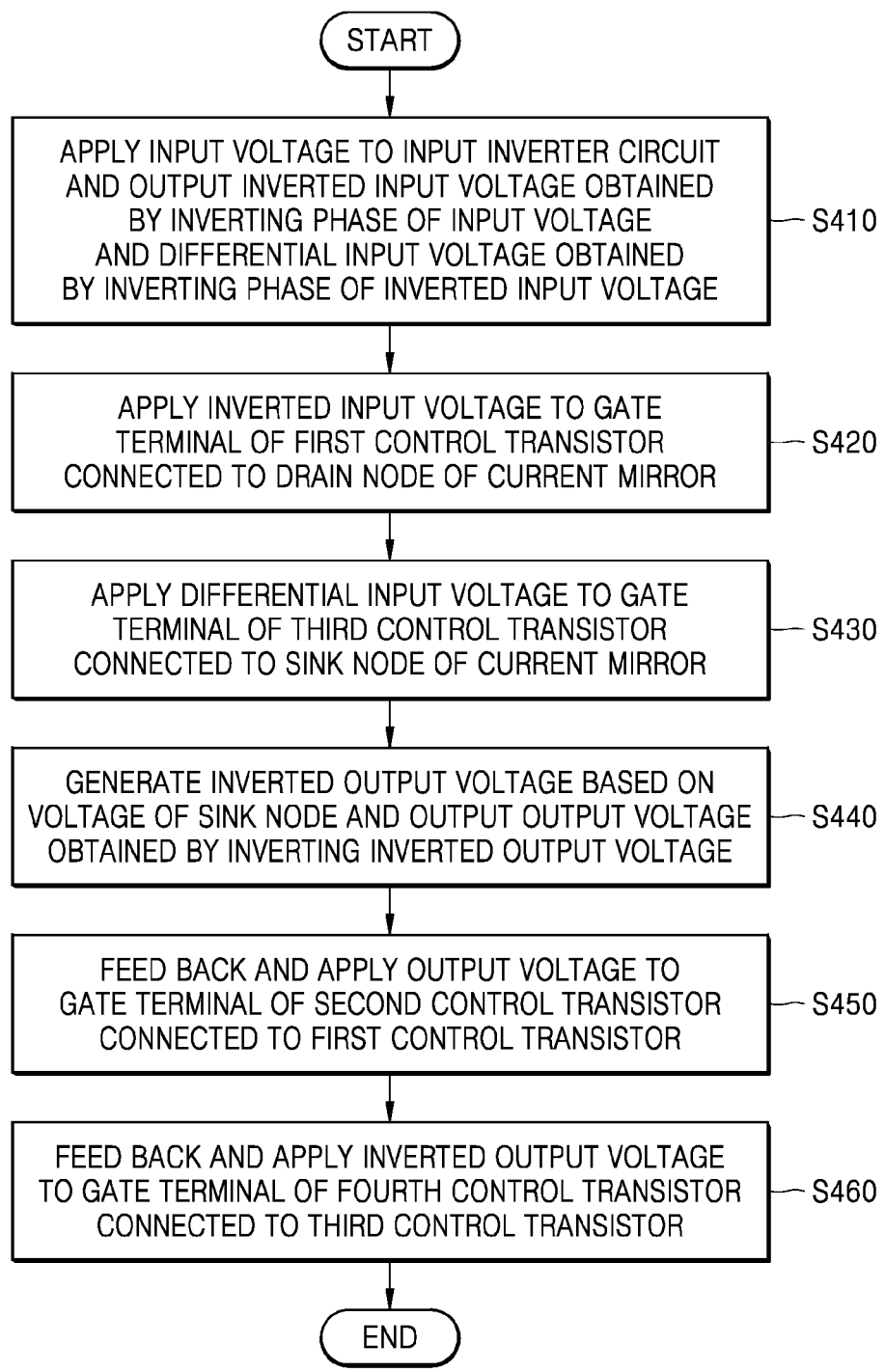
FIG. 10 is a flowchart of an operation method of a level shifter, according to an example embodiment of the inventive concept.

FIG. 10 is a flowchart of an operation method of the level shifter 10, according to an example embodiment of the inventive concept.

In operation S410, the input voltage VIN is applied to the input inverter circuit 100, and the input inverter circuit 100 may output the inverted input voltage VINB obtained by inverting a phase of the input voltage VIN and the differential input voltage VIND obtained by inverting a phase of the inverted input voltage VINB. The input voltage VIN may transition from the logic low level to the logic high level or transition from the logic high level to the logic low level. An operation method of the level shifter 10 according to the transition of the input voltage VIN will be described below with reference to FIGS. 11 and 12.

In operation S420, the inverted input voltage VINB may be applied to the gate terminal of the first control transistor MN1 connected to the drain node DR of the current mirror 210, and in operation S430, the differential input voltage VIND may be applied to the gate terminal of the third control transistor MN3 connected to the sink node SK of the current mirror 210.

In operation S440, the inverted output voltage VOUTB may be generated based on the sink node voltage VSK of the sink node SK, and the output voltage VOUT obtained by inverting the inverted output voltage VOUTB may be output.

According to an embodiment of the inventive concept, the latch circuit 310 may output the latch output voltage VLT by inverting the sink node voltage VSK, the first output inverter 321 may output the inverted output voltage VOUTB by inverting the latch output voltage VLT, and the second output inverter 322 may output the output voltage VOUT by inverting the inverted output voltage VOUTB.

In operation S450, the output voltage VOUT may be fed back and applied to the gate terminal of the second control transistor MN2 connected to the first control transistor MN1, and in operation S460, the inverted output voltage VOUTB may be fed back and applied to the gate terminal of the fourth control transistor MN4 connected to the third control transistor MN3.

Figure 11:
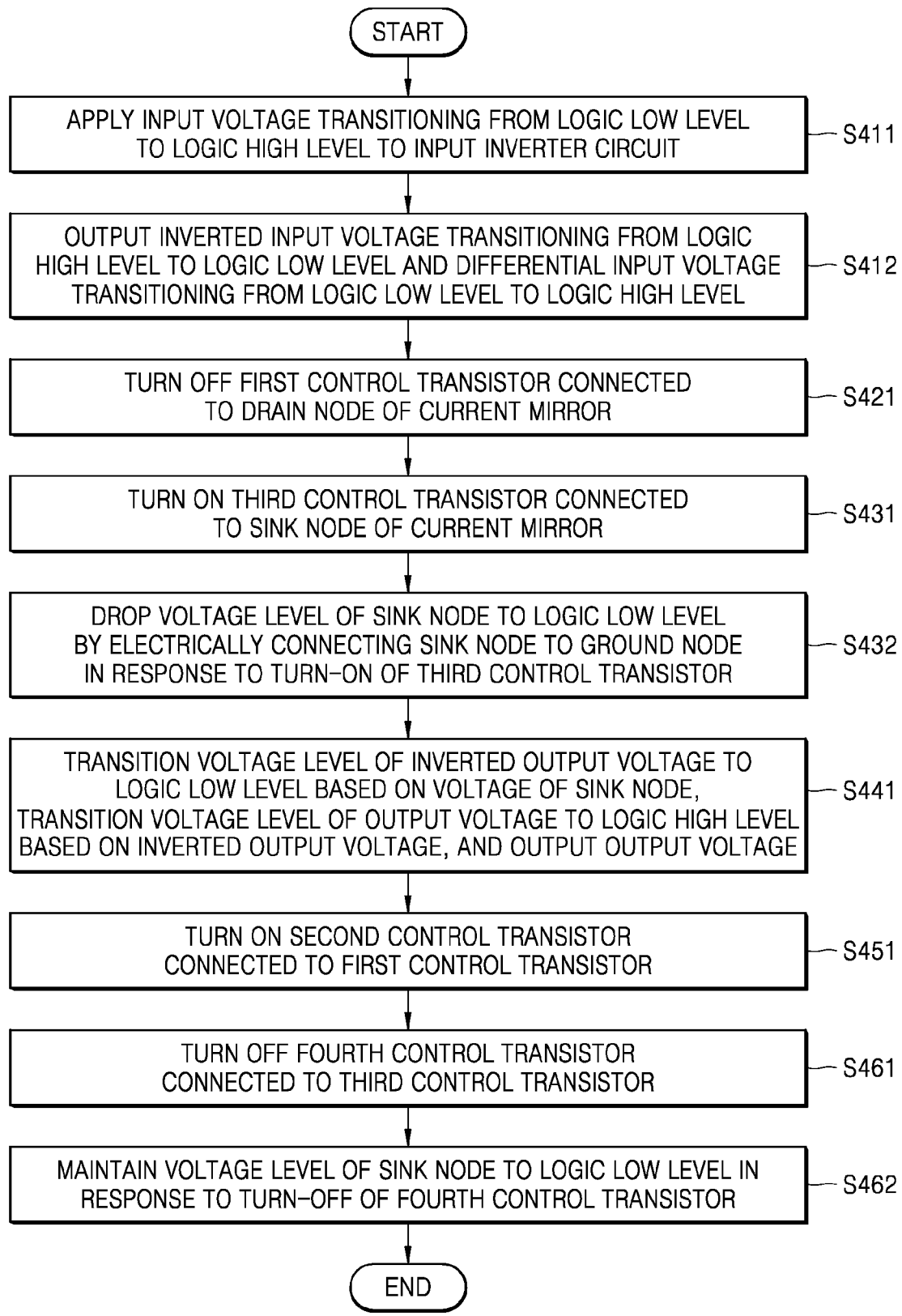
FIG. 11 is a flowchart of an operation method of a level shifter when an input voltage transitioning from the logic low level to the logic high level is applied thereto, according to an example embodiment of the inventive concept.

FIG. 11 is a flowchart of an operation method of the level shifter 10 when the input voltage VIN transitioning from the logic low level to the logic high level is applied thereto, according to an example embodiment of the inventive concept.

In operation S411, the input voltage VIN transitioning from the logic low level to the logic high level may be applied to the input inverter circuit 100. Accordingly, in operation S412, the inverted input voltage VINB transitioning from the logic high level to the logic low level and the differential input voltage VIND transitioning from the logic low level to the logic high level may be output.

In operation S421, the first control transistor MN1 connected to the drain node DR of the current mirror 210 may be turned off. In this case, the input inverter circuit 100 may apply the inverted input voltage VINB having the logic low level to the gate terminal of the first control transistor MN1.

In operation S431, the third control transistor MN3 connected to the sink node SK of the current mirror 210 may be turned on. In this case, the input inverter circuit 100 may apply the differential input voltage VIND having the logic high level to the gate terminal of the third control transistor MN3.

In operation S432, in response to the turning-on of the third control transistor MN3, the sink node SK may be electrically connected to the node of the ground voltage VSS so as to drop a voltage level of the sink node voltage VSK to the logic low level. According to an embodiment of the inventive concept, when the third control transistor MN3 is turned on in a state where the fourth control transistor MN4 is turned on, the sink node voltage VSK may drop based on the ground voltage VSS and may transit to the logic low level.

In operation S441, a voltage level of the inverted output voltage VOUTB may transit to the logic low level based on the sink node voltage VSK, a voltage level of the output voltage VOUT may transit to the logic high level based on the inverted output voltage VOUTB, and the output voltage VOUT may be output.

In operation S451, the second control transistor MN2 connected to the first control transistor MN1 may be turned on. For example, the second output inverter 322 may turn the second control transistor MN2 on by applying the output voltage VOUT having the logic high level to the gate terminal of the second control transistor MN2.

In operation S461, the fourth control transistor MN4 connected to the third control transistor MN3 may be turned off. For example, the first output inverter 321 may turn the fourth control transistor MN4 off by applying the inverted output voltage VOUTB having the logic low level to the gate terminal of the fourth control transistor MN4.

In operation S462, in response to the turning-off of the fourth control transistor MN4, the sink node voltage VSK may be maintained to the logic low level. For example, when the fourth control transistor MN4 is turned off in a state where the third control transistor MN3 is turned off, a current path between the sink node SK and the node of the ground voltage VSS may be blocked such that the sink node voltage VSK does no longer drop to the ground voltage VSS.

Figure 12:
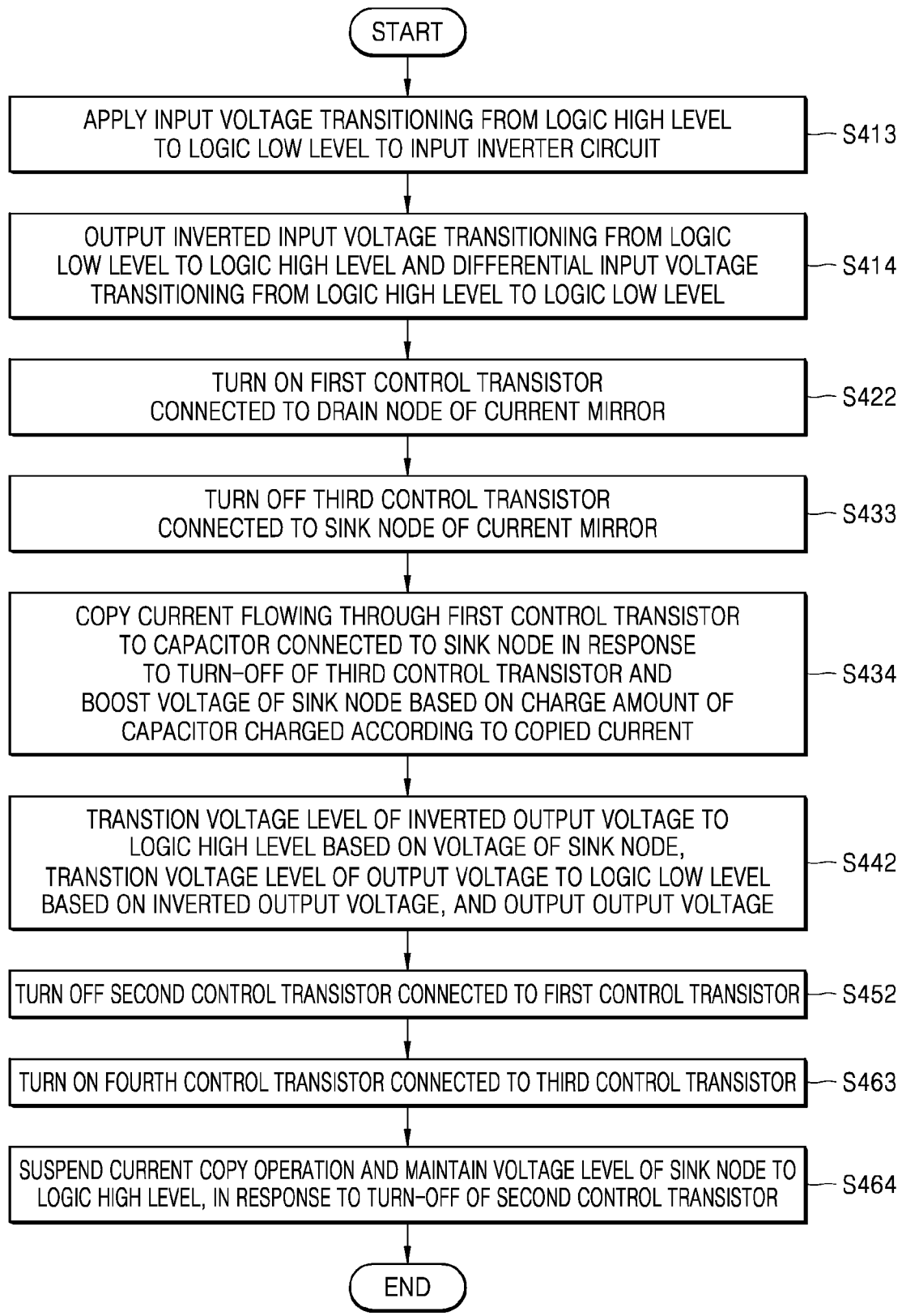
FIG. 12 is a flowchart of an operation method of a level shifter when an input voltage transitioning from the logic high level to the logic low level is applied thereto, according to an example embodiment of the inventive concept.

FIG. 12 is a flowchart of an operation method of the level shifter 10 when the input voltage VIN transitioning from the logic high level to the logic low level is applied thereto, according to an example embodiment of the inventive concept.

In operation S413, the input voltage VIN transitioning from the logic high level to the logic low level may be applied to the input inverter circuit 100. Accordingly, in operation S414, the inverted input voltage VINB transitioning from the logic low level to the logic high level and the differential input voltage VIND transitioning from the logic high level to the logic low level may be output.

In operation S422, the first control transistor MN1 connected to the drain node DR of the current mirror 210 may be turned on. In this case, the input inverter circuit 100 may apply the inverted input voltage VINB having the logic high level to the gate terminal of the first control transistor MN1.

In operation S433, the third control transistor MN3 connected to the sink node SK of the current mirror 210 may be turned off. In this case, the input inverter circuit 100 may apply the differential input voltage VIND having the logic low level to the gate terminal of the third control transistor MN3.

In operation S434, in response to the turning-off of the third control transistor MN3, the current IDR flowing through the first control transistor MN1 may be copied to the capacitor C connected to the sink node SK, and the sink node voltage VSK may be boosted based on a charge amount of the capacitor C charged according to the copied current ISK. For example, the sink node voltage VSK may be boosted to the level of the driving voltage VDDH.

In operation S442, the voltage level of the inverted output voltage VOUTB may transit to the logic high level based on the sink node voltage VSK, the voltage level of the output voltage VOUT may transit to the logic low level based on the inverted output voltage VOUTB, and the output voltage VOUT may be output.

In operation S452, the second control transistor MN2 connected to the first control transistor MN1 may be turned off. For example, the second output inverter 322 may turn the second control transistor MN2 off by applying the output voltage VOUT having the logic low level to the gate terminal of the second control transistor MN2.

In operation S463, the fourth control transistor MN4 connected to the third control transistor MN3 may be turned on. For example, the first output inverter 321 may turn the fourth control transistor MN4 on by applying the inverted output voltage VOUTB having the logic high level to the gate terminal of the fourth control transistor MN4.

In operation S464, in response to the turning-off of the second control transistor MN2, a current copy operation is suspended and the sink node voltage VSK may be maintained to the logic high level. For example, when the second control transistor MN2 is turned off while the current mirror 210 is copying a current, a current path from the drain node DR to the node of the ground voltage VSS may be blocked. Accordingly, the current IDR to be copied may no longer flow, and the sink node voltage VSK may no longer be boosted.

Figure 13:
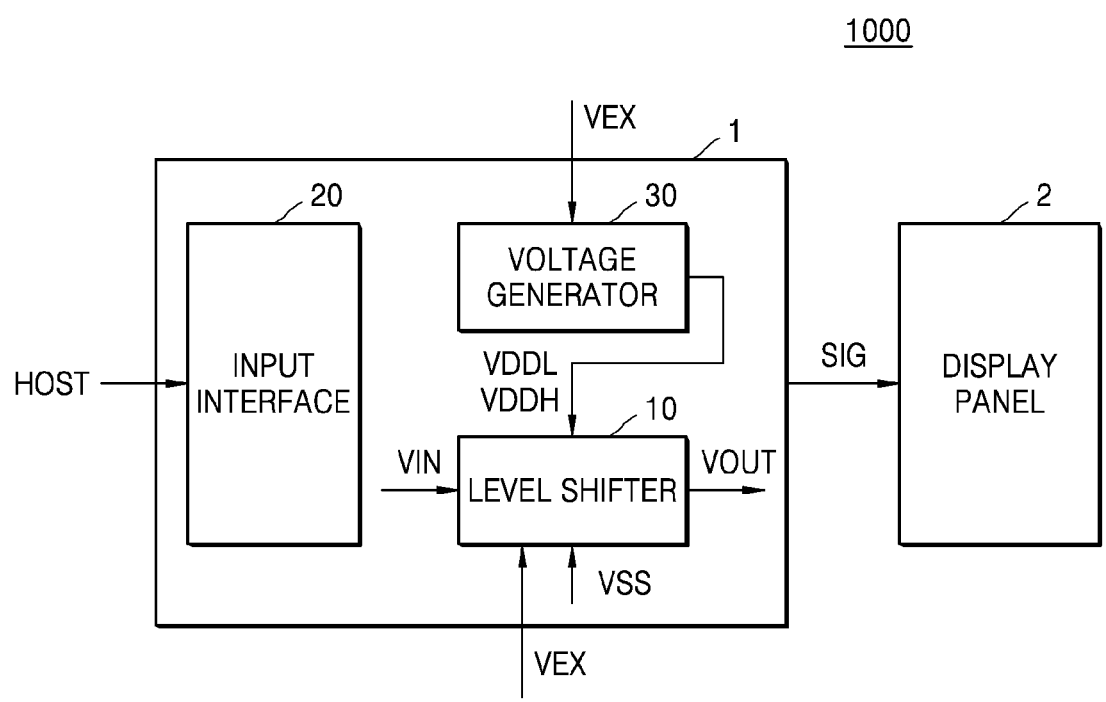
FIG. 13 is a block diagram of an electronic device including a display driving circuit and a display panel according to an example embodiment of the inventive concept.

FIG. 13 is a block diagram of an electronic device including a display driving circuit 1 and a display panel 2. The display driving circuit 1 may include the level shifter 10 according to an example embodiment of the inventive concept. Herein, the display driving circuit 1 including the level shifter 10 may be a DDI and the electronic device including the display driving circuit 1 and the display panel 2 may be an OLED TV.

Referring to FIG. 13, the display driving circuit 1 may include the level shifter 10 disclosed above, an input interface 20, and a voltage generator 30.

The input interface 20 may receive a command from a host for driving the display panel 2. The voltage generator 30 may receive an external voltage VEX and apply the inverter driving voltage VDDL and the driving voltage VDDH to the level shifter 10.

The display driving circuit 1 may transmit various signals SIG to the display panel 2 based on the received command. The signals SIG may include, for example, a vertical scanning signal, a horizontal scanning signal, and the like.

According to an embodiment of the inventive concept, the level shifter 10 may receive the input voltage VIN and the external voltage VEX or the internal voltage (e.g., VDDL and VDDH) of the voltage generator 30, and shift a voltage level of the input voltage VIN. For example, the input voltage VIN may be applied from at least one of the input interface 20 and the voltage generator 30. As another example, the input voltage VIN may be a host voltage or the external voltage VEX.

The display driving circuit 1 may transmit the signals SIG to the display panel 2 based on the output voltage VOUT higher than the maximum level of the input voltage VIN. For example, when the display panel 2 is a panel including an organic light-emitting diode (OLED) element, the display panel 2 may demand a relatively high current amount or voltage level. In this case, the display driving circuit 1 may provide the signals SIG having a high voltage level to drive the display panel 2. Therefore, the level shifter 10 may provide the output voltage VOUT having an increased voltage level from that of the input voltage VIN. For example, when the input voltage VIN has a voltage level greater than or equal to 0 V and less than 5 V, the output voltage VOUT may have a voltage level greater than or equal to 0 V and less than 15 V.

According to embodiments of the inventive concept, a current mirror control circuit including a plurality of transistors may block a leakage current output from a current mirror, thereby removing a non-desired toggle component from an output voltage output from a level shifter.

As described above, example embodiments are disclosed with reference to the drawings and the description. Although particular terms are used to describe the embodiments in the specification, these terms are used to describe the technical idea of the inventive concept but are not used to limit the meaning or limit the scope of the inventive concept in the claims. While the inventive concept has been particularly shown and described with reference to embodiments thereof, it will be understood that various changes in form and details may be made therein without departing from the spirit and scope of the following claims.

What is claimed is:

1. A semiconductor device comprising:
a level shifter configured to output an output voltage in response to an input voltage, the output voltage having a voltage level range different from a voltage level range of the input voltage, wherein the level shifter comprises:
a current mirror connected to a driving voltage terminal and including first through third mirror transistors, the current mirror configured to copy a reference current flowing through the first mirror transistor to the second mirror transistor;
a current mirror control circuit electrically connected to the current mirror by a sink node and comprising a plurality of control transistors configured to control the current mirror; and
an output circuit configured to output the output voltage based on a voltage level of the sink node,
wherein a first control transistor of the plurality of control transistors is configured to receive the output voltage fed back to a gate terminal of the first control transistor,
wherein a second control transistor of the plurality of control transistors is configured to receive an inverted output voltage fed back to a gate terminal of the second control transistor, and
wherein second source/drain terminals of the first through third mirror transistors are connected to the driving voltage terminal, a first source/drain terminal of the third mirror transistor is connected to gate terminals of the first and second mirror transistors, and a gate terminal of the third mirror transistor is connected to the sink node.

2. The semiconductor device of claim 1, wherein a first source/drain terminal of the first mirror transistor is electrically connected to the gate terminal of the first mirror transistor and the gate terminal of the second mirror transistor by a drain node,
wherein a second source/drain terminal of a third control transistor of the plurality of control transistors is connected to the first source/drain terminal of the first mirror transistor, a first source/drain terminal of the third control transistor is connected to a second source/drain terminal of the first control transistor, and a first source/drain terminal of the first control transistor is connected to a node of a ground voltage, and
wherein at least one of the third control transistor and the first control transistor is turned off so as for a current not to flow from the drain node to the node of the ground voltage when the input voltage transitions from a logic low to a logic high.

3. The semiconductor device of claim 2, configured such that when the input voltage is transitioned from the logic low to the logic high:
the current mirror control circuit drops a voltage of the sink node to the ground voltage, and
the output circuit outputs voltage having the logic high.

4. The semiconductor device of claim 3, configured such that when the input voltage is transitioned from the logic high to the logic low:
the current mirror control circuit controls the current mirror such that the current mirror copies a current by turning the first control transistor and the third control transistor on,
the current mirror outputs the voltage of the sink node, the voltage having the logic high, and
the output circuit outputs the output voltage having the logic low.

5. The semiconductor device of claim 2, further comprising:
an input inverter circuit configured to receive the input voltage and output an inverted input voltage based on the input voltage,
wherein the inverted input voltage is applied to a gate terminal of the third control transistor, and the output voltage is applied to a gate terminal of the first control transistor.

6. The semiconductor device of claim 5, configured such that when the input voltage has the logic high:
the current mirror control circuit turns the third control transistor off based on the inverted input voltage, and turns the first control transistor on based on the output voltage fed back to the gate terminal of the first control transistor,
the first control transistor is turned on after the third control transistor is turned off, and
the inverted input voltage has the logic low, and the output voltage has the logic high.

7. The semiconductor device of claim 2, wherein the current mirror control circuit comprises a fourth control transistor connected to the sink node,
wherein the second control transistor is connected to the fourth control transistor and the node of the ground voltage,
wherein the current mirror control circuit is further configured to turn at least one of the second control transistor and the fourth control transistor off, and
wherein the current mirror is further configured to boost a voltage of the sink node by outputting a current to a capacitor electrically connected to the sink node when the input voltage transitions from the logic high to the logic low.

8. The semiconductor device of claim 7, further comprising:
an input inverter circuit configured to receive the input voltage and output an inverted input voltage and a differential input voltage based on the input voltage,
wherein the differential input voltage is applied to a gate terminal of the fourth control transistor, and the inverted output voltage is applied to a gate terminal of the second control transistor.

9. The semiconductor device of claim 1, wherein the output circuit comprises:
a latch circuit configured to receive a voltage of the sink node and output a latch output voltage obtained by inverting a phase of the voltage of the sink node; and
an output inverter circuit comprising a plurality of inverters and configured to receive the latch output voltage and output the inverted output voltage and the output voltage.

10. The semiconductor device of claim 9, wherein the latch circuit is further configured to output the latch output voltage having a logic low when the sink node has a logic high, and to output the latch output voltage having the logic high when the sink node has the logic low.

11. An operation method of a level shifter for outputting an output voltage by receiving an input voltage, the output voltage having a voltage level range different from a voltage level range of the input voltage, the operation method comprising:
applying the input voltage to an input inverter circuit and outputting an inverted input voltage obtained by inverting a phase of the input voltage and a differential input voltage obtained by inverting a phase of the inverted input voltage;
applying the inverted input voltage to a gate terminal of a first control transistor connected to a drain node of a current mirror;
applying the differential input voltage to a gate terminal of a third control transistor connected to a sink node of the current mirror;
generating an inverted output voltage based on a voltage of the sink node and outputting the output voltage by inverting the inverted output voltage;
feeding back the output voltage and the inverted output voltage;
applying the output voltage to a gate terminal of a second control transistor connected to the first control transistor;
applying the inverted output voltage to a gate terminal of a fourth control transistor connected to the third control transistor;
copying a current flowing through a first mirror transistor of the current mirror to a second mirror transistor of the current mirror in response to turning on of the first and second control transistors; and
turning on a third mirror transistor of the current mirror in response to turning on of the third and fourth control transistors and turning off the third mirror transistor in response to turning off of at least one of the third and fourth control transistors,
wherein the turning on of the third mirror transistor further comprises applying a voltage to gate terminals of the first and second mirror transistors.

12. The operation method of claim 11, wherein the input voltage includes a voltage transitioning from a logic low to a logic high, the inverted input voltage includes a voltage transitioning from the logic high to the logic low, the differential input voltage includes a voltage transitioning from the logic low to the logic high,
wherein the applying of the inverted input voltage to the gate terminal of the first control transistor connected to the drain node of the current mirror further comprises turning the first control transistor off, and
wherein the applying of the differential input voltage to the gate terminal of the third control transistor connected to the sink node of the current mirror further comprises turning the third control transistor on, and
further comprising dropping a voltage level of the sink node to the logic low in response to turning-on of the third control transistor.

13. The operation method of claim 12, wherein the generating of the inverted output voltage based on the voltage of the sink node and the outputting of the output voltage obtained by inverting the inverted output voltage further comprises:
transitioning the inverted output voltage to the logic low based on the dropped voltage of the sink node,
transitioning the output voltage to the logic high based on the inverted output voltage, and
outputting the output voltage having the logic high.

14. The operation method of claim 13, wherein the applying of the output voltage to the gate terminal of the second control transistor connected to the first control transistor further comprises turning the second control transistor on, and
wherein the applying of the inverted output voltage to the gate terminal of the fourth control transistor connected to the third control transistor further comprises turning the fourth control transistor off, and
further comprising maintaining the voltage level of the sink node to the logic low in response to turning-off of the fourth control transistor.

15. The operation method of claim 11, wherein the input voltage includes a voltage transitioning from a logic high to a logic low, the inverted input voltage includes a voltage transitioning from the logic low to the logic high, the differential input voltage includes a voltage transitioning from the logic high to the logic low,
wherein the applying of the inverted input voltage to the gate terminal of the first control transistor connected to the drain node of the current mirror further comprises turning the first control transistor on, and
wherein the applying of the differential input voltage to the gate terminal of the third control transistor connected to the sink node of the current mirror further comprises turning the third control transistor off, and
further comprising boosting the voltage of the sink node in response to turning-off of the third control transistor.

16. The operation method of claim 15, wherein the boosting of the voltage of the sink node further comprises:
copying a current flowing through the first control transistor to a capacitor connected to the sink node, and
boosting the voltage of the sink node based on a charge amount of the capacitor charged according to the copied current.

17. The operation method of claim 11, wherein the turning on and off of the third mirror transistor further comprise applying the voltage of the sink node to a gate terminal of the third mirror transistor.

18. The operation method of claim 11, wherein the inverted output voltage includes a voltage obtained by inverting a latch output voltage obtained by inverting the voltage of the sink node, and wherein the latch output voltage includes a voltage of a logic low when the voltage of the sink node has a logic high, and the latch output voltage includes a voltage of the logic high when the voltage of the sink node has the logic low.

19. A semiconductor device comprising:

a level shifter configured to output an output voltage in response to an input voltage, the output voltage having a voltage level range different from a voltage level range of the input voltage, wherein the level shifter comprises:

an input inverter circuit configured to receive the input voltage and output an inverted input voltage and a differential input voltage inverting the inverted input voltage, based on the input voltage;

a current mirror comprising first through third mirror transistors configured to:

copy a current flowing through a first source/drain terminal of the first mirror transistor to a first source/drain terminal of the second mirror transistor, share a driving voltage applied to a second source/drain terminal of each of the first and second mirror transistors, and share a voltage applied to a gate terminal of each of the first and second mirror transistors; and a current mirror control circuit comprising:

a first control transistor connected to the first source/drain terminal of the first mirror transistor by a first source/drain terminal of the first control transistor, a second control transistor connected to a second source/drain terminal of the first control transistor by a first source/drain terminal of the second control transistor, a third control transistor connected to the first source/drain terminal of the second mirror transistor by a first source/drain terminal of the third control transistor, and a fourth control transistor connected to a second source/drain terminal of the third control transistor by a first source/drain terminal of the fourth control transistor, wherein the inverted input voltage is applied to a gate terminal of the first control transistor, the output voltage is fed back to a gate terminal of the second control transistor, the differential input voltage is applied to a gate terminal of the third control transistor, and an inverted output voltage is applied to a gate terminal of the fourth control transistor, and wherein the current mirror is further configured to apply the driving voltage to gate terminals of the first and second mirror transistors through the third mirror transistor when a voltage of the first source/drain terminal of the second mirror transistor has a logic low.

20. The semiconductor device of claim 19, wherein the input inverter circuit is further configured to output the differential input voltage transitioning from a logic low to a logic high and the inverted input voltage transitioning from the logic high to the logic low to the current mirror control circuit when the output voltage has the logic low and the inverted output voltage has the logic high, and the current mirror is further configured to allow a voltage level of the first source/drain terminal of the second mirror transistor to have the logic low.

* * * * *